(12) United States Patent
Werner

(10) Patent No.: US 6,512,251 B2
(45) Date of Patent: Jan. 28, 2003

(54) SEMICONDUCTOR SWITCHING ELEMENT THAT BLOCKS IN BOTH DIRECTIONS

(75) Inventor: Wolfgang Werner, München (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/867,491

(22) Filed: May 30, 2001

(65) Prior Publication Data

US 2001/0054742 A1 Dec. 27, 2001

(30) Foreign Application Priority Data

May 30, 2000 (DE) .......................... 100 26 742

(51) Int. Cl.⁷ .............................. H01L 29/72
(52) U.S. Cl. ................. 257/135; 257/148; 257/156; 257/378; 257/394; 257/547; 257/590
(58) Field of Search ................. 257/378, 135, 257/148, 156, 394, 547, 590

(56) References Cited

U.S. PATENT DOCUMENTS

| 4,961,100 A | 10/1990 | Baliga et al. |
| 5,877,538 A | 3/1999 | Williams |
| 5,900,652 A | * 5/1999 | Battaglia et al. ............ 257/378 |

FOREIGN PATENT DOCUMENTS

| DE | 38 24 836 C2 | 2/1989 |
| DE | 39 39 305 C2 | 6/1990 |
| EP | 0 656 661 A1 | 6/1995 |
| JP | 55 133 574 A | 10/1980 |

* cited by examiner

Primary Examiner—Edward Wojciechowicz
(74) Attorney, Agent, or Firm—Laurence A. Greenberg; Werner H. Stemer; Ralph E. Locher

(57) ABSTRACT

The semiconductor switching element blocks in both directions between a first and a second load terminal. The switching element has a field effect transistor and a bipolar transistor. The field effect transistor has a controlled gate, a source connected to the first load terminal, a drain connected to the second load terminal and a body connection. The bipolar transistor has a base, an emitter, and a collector. The emitter is connected to the body connection of the field effect transistor.

12 Claims, 3 Drawing Sheets

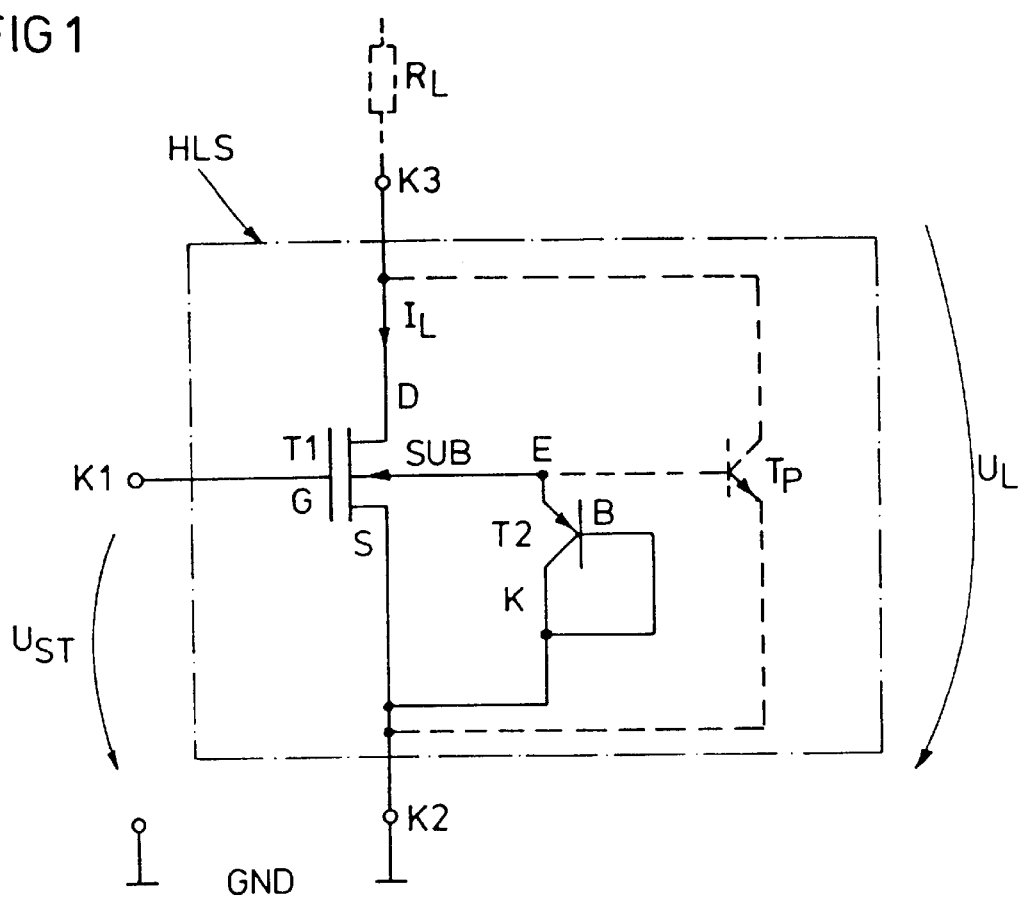
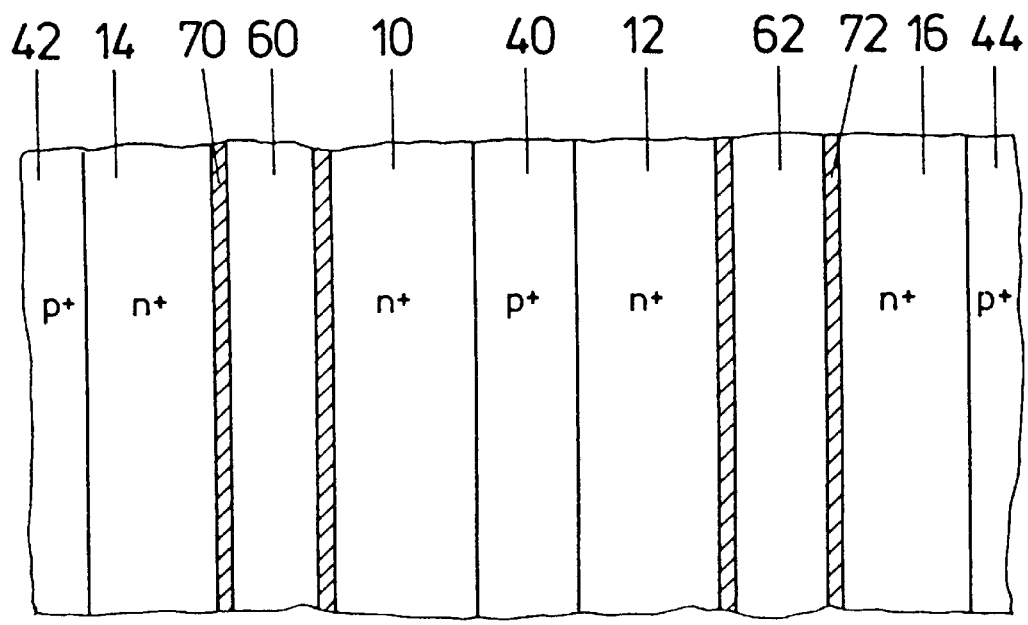

SEMICONDUCTOR SWITCHING ELEMENT THAT BLOCKS IN BOTH DIRECTIONS

BACKGROUND OF THE INVENTION

FIELD OF THE INVENTION

The invention lies in the semiconductor technology field and pertains, more specifically, to a semiconductor switching element that blocks in both directions.

In order to switch currents or to apply voltages to loads, it has been known to use semiconductor switching elements, for example a MOSFET (metal oxide semiconductor field effect transistor). Areas of application are, for example, motor vehicle electrics or switched-mode power supplies, in which "power MOSFETs" are used that are capable of switching the high currents or voltages which occur there.

As a result of the sequence of differently doped regions which are present in a MOSFET, namely a source region of a first conductivity type, a body region of a second conductivity type complementary to the first conductivity type, and a drain region of the first conductivity type, there is always a parasitic bipolar transistor present in the MOSFET, its base being formed by the body region and its emitter/collector being formed by the source region/drain region. In order to prevent the effects of this parasitic bipolar transistor on the dielectric strength of the MOSFET, it is conventional to short-circuit the source region and the body region of the MOSFET. This is described, for example, in the prior art cited in European patent EP 0 656 661 B1 (there, see FIG. 12).

If the source region and the body region were not short-circuited, charge carriers could accumulate in the body region during operation, that is to say when a drive potential is applied to the gate connection and a flow voltage is applied between drain and source, and would activate a parasitic bipolar transistor, which has the effect of a considerable reduction in the dielectric strength of the MOSFET. The dielectric strength of such a MOSFET in the drain-source direction is about only ⅓ of the dielectric strength of a MOSFET with a short-circuited body and source region, in which the effect of the short circuit is that source and body are always at the same potential, so that no charge carriers can accumulate in the body region.

However, short-circuiting the source and body regions has the disadvantage that the MOSFET can block only in one direction, the drain-source direction (which is usually referred to as the forward direction), while it conducts like a diode in the source-drain direction (reverse direction) when a flow voltage is applied.

In many applications, however, it is desirable to use a semiconductor switch which can block in both directions when no drive potential is present. In the case of the conventional MOSFET with a short circuit between source and body regions, this can be achieved only by means of complicated additional circuit measures.

European patent EP 0 656 661 B1 proposes replacing the short circuit by a conductive connection with a resistance, in order to increase the voltage drop across the component when a voltage is applied in the reverse direction.

SUMMARY OF THE INVENTION

It is accordingly an object of the invention to provide a two-way blocking semiconductor switching element, which overcomes the above-mentioned disadvantages of the heretofore-known devices and methods of this general type and which blocks in both directions and which can be implemented simply with known means.

With the foregoing and other objects in view there is provided, in accordance with the invention, a semiconductor switching element, comprising:

a control connection, a first load connection, and a second load connection;

a field effect transistor with a gate connected to the control connection, a source connected to the first load connection, a drain connected to the second load connection, and a body connection;

a bipolar transistor with a base, an emitter connected to the body connection of the field effect transistor, and a collector.

In other words, the semiconductor switching element has a field effect transistor whose gate connection is connected to a control connection of the semiconductor switching element, whose source connection is connected to a first load connection of the semiconductor switching element, and whose drain connection is connected to a second load connection of the semiconductor switching element. A bipolar transistor is connected by one emitter connection to a body connection of the field effect transistor. A base connection of the bipolar transistor and a collector connection of the bipolar transistor are preferably connected to the source connection of the field effect transistor or to the first load connection of the semiconductor switching element.

For the semiconductor switching element according to the invention, it is possible to use a field effect transistor which does not have any short circuit between body region and source, as a result of which the field effect transistor blocks in both directions and as a result of which the semiconductor switching element blocks both when a flow voltage is applied in the direction from the first to the second load connection, which corresponds to the forward direction of the field effect transistor, and when a flow voltage is applied in the direction from the second to the first load connection (the reverse direction of the field effect transistor). The bipolar transistor connected by its emitter to the body region of the field effect transistor "sucks away" charge carriers which accumulate in the body region of the field effect transistor. As a result, the parasitic bipolar transistor formed from the sequence of differently doped regions in the field effect transistor cannot be driven. The breakdown voltage of the field effect transistor in the forward direction, as a result of being connected to the bipolar transistor, substantially corresponds to the breakdown voltage of a corresponding field effect transistor with a short circuit between source and body regions.

If an n-channel field effect transistor is used, the bipolar transistor is a pnp bipolar transistor. If a p-channel field effect transistor is used, the bipolar transistor is an npn bipolar transistor.

The bipolar transistor is advantageously dimensioned such that it has a high current gain, preferably above 100, in order to lead charge carriers away from the body region as effectively as possible.

The field effect transistor and the bipolar transistor can be integrated in a common semiconductor body or in separate semiconductor bodies.

With the above and other objects in view there is also provided, in accordance with the invention, an integrated semiconductor switching element, comprising:

a first connection zone of a first conductivity type;

a second connection zone of the first conductivity type;

a body zone of a second conductivity type disposed between the first and second connection zones;

a control electrode adjacent the body zone and an insulating layer separating the control electrode from the body zone;

a third connection zone of the second conductivity type; and a base zone of the first conductivity type between the body zone and the third connection zone.

In this specific implementation, there is provided an integrated semiconductor switching element, in which the field effect transistor and the bipolar transistor are integrated in a semiconductor body. It is possible, in the case of the semiconductor switching element according to the invention, for the production of the bipolar transistor to be integrated in a straightforward way into the production process of the field effect transistor.

The semiconductor switching element according to the invention has a first connection zone of a first conductivity type, a second connection zone of a first conductivity type, a body zone of a second conductivity type arranged between the first and second connection zones, and a control electrode arranged adjacent to the body zone and separated from the body zone by an insulating layer. In this case, the first and second connection zones form, for example, the source/drain zones of a field effect transistor. The control electrode forms, for example, the gate electrode of a field effect transistor. In addition, the integrated semiconductor switching element has a third connection zone of the first conductivity type and a base zone of the first conductivity type arranged between the body zone and the third connection zone. The third connection zone, which is preferably short-circuited with the first connection zone, forms the collector of the bipolar transistor, the base zone arranged between the body region and the third connection zone constituting the base of the bipolar transistor.

Other features which are considered as characteristic for the invention are set forth in the appended claims.

Although the invention is illustrated and described herein as embodied in a semiconductor switching element that blocks in both directions, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a circuit diagram of a semiconductor switching element according to the invention;

FIG. 3 is a plan view onto a section taken along the line III—III through the semiconductor switching element of FIG. 2;

DESCRIPTION OF THE PREFERRED EMBODIMENTS

Figure 2:
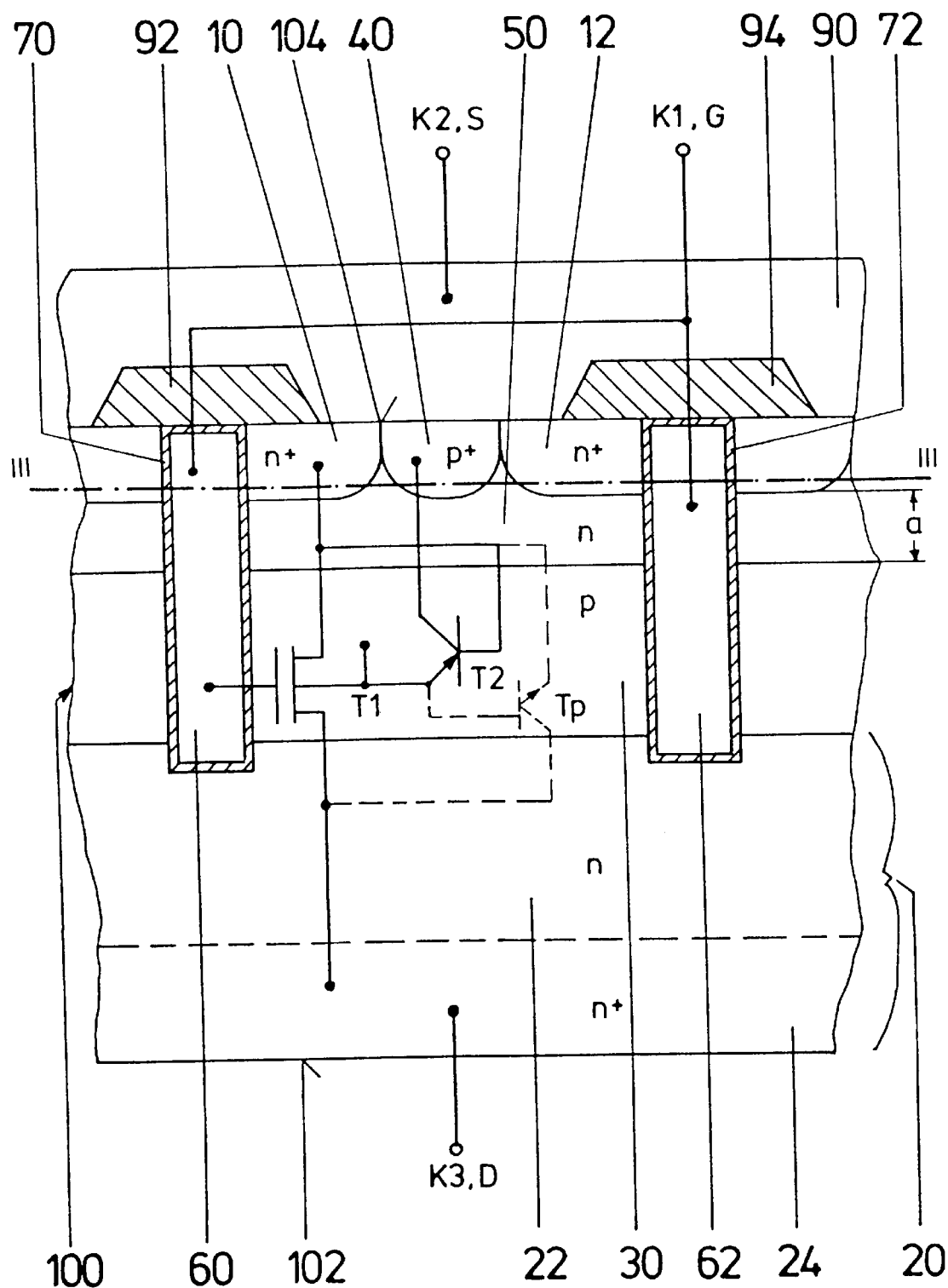
FIG. 2 is a cross-sectional illustration of a semiconductor switching element integrated in a semiconductor body in accordance with a first embodiment.

Unless otherwise specified, identical or functionally equivalent parts are identified with the same reference symbols throughout the figures.

Referring now to the figures of the drawing in detail and first, particularly, to FIG. 1 thereof, there is shown the equivalent circuit diagram of a semiconductor switching element HLS according to the invention, which blocks in both directions. The semiconductor switching element HLS has a control terminal K1 for the application of a drive signal $U_{ST}$, and a first and second load connection K2, K3 to be connected to a load circuit. The semiconductor switching element HLS in FIG. 1 is connected in series with a load RL between a supply potential V+ and a reference potential GND for the purpose of better understanding.

The semiconductor switching element HLS according to the invention has a field effect transistor T1, for example a MOSFET. The field effect transistor T1 has a gate connection G connected to the control connection K1, a source connection connected to the first load connection K2, and a drain connection connected to the second load connection K3.

In addition, the semiconductor switching element HLS according to the invention has a bipolar transistor T2. An emitter connection E of the bipolar transistor T2 is connected to a body connection SUB of the field effect transistor T1. The body zone and the source zone are not short-circuited in the case of the field effect transistor T1 used.

In the exemplary embodiment according to FIG. 1, a base connection B and a collector connection K of the bipolar transistor T2 are jointly connected to the source connection S of the field effect transistor T1 and therefore to the first load connection K2 of the semiconductor switching element HLS. The field effect transistor of the exemplary embodiment is an n-channel field effect transistor, while the bipolar transistor T2 is a pnp bipolar transistor. If a p-channel field effect transistor is used, then the bipolar transistor chosen must be an npn bipolar transistor.

The functioning of the semiconductor switching element illustrated will be explained below:

If a control voltage $U_{ST}$ is applied to the control connection K1 of the semiconductor switching element HLS and therefore to the gate connection of the field effect transistor T1, and if there is a load section voltage $U_L$ between the load connections K2, K3 of the semiconductor switching element, and therefore the drain and source connections D, S of the field effect transistor T1, then the field effect transistor T1 conducts and accepts a load current $I_L$. In the process, positive charge carriers accumulate in the body region of the field effect transistor T1, as a result of which the potential of the body region SUB rises. If the potential on the body connection reaches a value at which the voltage present between the reference potential GND or the base B of the bipolar transistor T2 is sufficient to turn the bipolar transistor T2 on, then the positive charge carriers accumulating in the body region SUB will be dissipated to reference potential GND via the bipolar transistor T2. Instead of the reference potential GND, the base and the collector of the bipolar transistor T2 could also be connected to a potential which is preferably lower than the reference potential GND, in order to switch the bipolar transistor T2 on at an even lower potential on the body connection.

A parasitic bipolar transistor Tp which is present in the field effect transistor T1 and is illustrated dashed in FIG. 1 is not driven, because of the discharging of the body region SUB to reference potential GND via the bipolar transistor T2. The parasitic bipolar transistor Tp therefore does not influence the dielectric strength of the field effect transistor T1.

Since, in the field effect transistor T1, body SUB and source S are not short-circuited, the field effect transistor T1 illustrated, and therefore the semiconductor switching element HLS according to the invention, also blocks in the reverse direction, that is to say when a positive voltage is applied between the first load connection K2 and the second load connection K3. The dielectric strength in the reverse direction in this case depends on the dimensioning of the bipolar transistor T2. The dielectric strength in the reverse direction does normally not reach the value of the dielectric strength in the forward direction.

Referring now to FIG. 2, there is shown an exemplary embodiment for implementing a circuit arrangement according to the invention with a field effect transistor and a bipolar transistor in a semiconductor body. In this case, FIG. 2 shows a cross section through the semiconductor body in the vertical direction, while FIG. 3 represents a cross section through the semiconductor body along the section plane III—III drawn in FIG. 2. The semiconductor body 100 has at least a first connection zone 10, 12, 14, 16 and at least a second connection zone 20. The second connection zone 20, which forms the drain zone of the field effect transistor, in the exemplary embodiment comprises a highly n-doped region 24, to which the drain electrode D can be connected, for example by means of a non-illustrated metallization, and a more weakly n-doped region 22 located above it. Above the second connection zone 20 there is a p-doped body zone 30. The first connection zone 10, 12, 14, 16 which, in the exemplary embodiment, comprises a number of highly n-doped regions, is arranged on a front side 104, that is to say a side located opposite the second connection zone 20, of the semiconductor body 100. Contact is made with the highly n-doped zones 10, 12, 14, 16, which form the first connection zone, by means of a common electrically conductive layer, for example of aluminum, applied to the semiconductor body 100. The first connection zone 10, 12, 14, 16 forms the source zone of the field effect transistor. The electrically conductive layer 90 in this case forms the source electrode S of the field effect transistor and, respectively, the second load connection K2 of the semiconductor switching element according to the invention.

The semiconductor body has at least a third highly p-doped zone 40 which, in the exemplary embodiment, is arranged in the region of the front side 104 of the semiconductor body 100, beside the first connection zone 10, 12, the first connection zone 10, 12 and the third connection zone 40 being short-circuited by means of the electrically conductive layer 90. Formed between the body zone 30 and the third connection zone 40 is an n-conducting base zone 50. The base zone separates the body zone 30 and the third connection zone 40.

The body zone 30 forms the emitter E of the bipolar transistor T2 shown in FIG. 1, the base zone 50 forms the base of this bipolar transistor T2, and the third connection zone 40 forms the collector of the bipolar transistor T2. For the purpose of better understanding with regard to the function of the zones illustrated in FIG. 3, the switching symbols of the field effect transistor T1 and of the bipolar transistor T2 from FIG. 1 are also shown in FIG. 2.

Also incorporated in the semiconductor body 100 is at least one control electrode 60, 62, which extends into the semiconductor body 100 in the vertical direction in such a way that a control electrode 60, 62 extends adjacently to at least one of the highly doped zones 10, 12, 14, 16 of the first connection zone and of the body region 30, each control electrode 60, 62 extending into the drain zone 20 in the exemplary embodiment.

The semiconductor body according to FIGS. 2 and 3 has in each case a number of identically constructed cells each having a control electrode 60, 62, which together form the gate electrode of the field effect transistor. In this case, the regions with the same function, that is to say all the control electrodes 60, 62, all the first connection zones 10, 12, 14, 16 are each connected to a common connection G, S, so that all the cells are driven in the same way. As a result of the cell-like structure of the component, the current passage area and therefore the current-carrying capacity of the component may be increased.

As revealed in particular by FIG. 3, the first connection zones 10, 12, 14, 16, the third connection zones 40, 42, 44 and the control electrodes 60, 62 extend at right angles to the plane of the drawing of FIG. 2 in such a way that elongate, plate-like control electrodes 60, 62 are produced, along which conductive channels form when a drive potential is applied. The control electrodes 60, 62 are each insulated with respect to the semiconductor body 100 by an insulating layer 70, 72, preferably an oxide layer. Incorporated in the electrically conductive layer 90 are insulating regions 92, 94, which insulate the electrically conductive layer 90 with respect to the control electrodes 60, 62.

If a positive drive potential is applied to the control electrodes 60, 62, that is to say to the gate connection G of the field effect transistor T1 or the control connection K1 of the semiconductor switching element according to the invention, and if a positive voltage is applied between the drain connection D and the source connection S or between the first and second load connections K2, K3, then a conductive channel is formed in the body zone 30 along the control electrodes 60, 62, via which channel charge carriers pass out of the drain zone 20 into the source zone 10, 12, 14, 16. If the drive potential is removed from the control electrodes 60, 62, the conductive channel is broken and the field effect transistor T1 or the semiconductor switching element HLS according to the invention blocks. When a positive voltage is applied between drain D and source S, charge carriers, namely holes and electrons, are generated in a space charge zone between the drain zone 22 and the body zone 30. Because of the field in the space charge zone, the electrons flow into the drain zone 20 or into the drain electrode K3, D, and the holes flow into the body zone 30. Since, according to the invention, the body zone is not connected to the source zone 10, the holes cannot flow away and charge the body zone up to a positive potential. At the same time, a flow voltage builds up between the body zone 30 and the base zone 50, which has the effect that the holes are injected into the base zone 50. The holes are absorbed from the base zone 50 of the third connection zone 40, which forms the collector of the pnp transistor, and flow away via the source electrode K2, S. This prevents a parasitic bipolar transistor Tp, which is formed by the sequence of the n-conducting drain zone 20, the p-conducting body zone 30 and the n-conducting source zone 10, 12, 14, 16 and whose switching symbol is shown dashed in FIG. 2, becoming active and reducing the blocking voltage of the field effect transistor in the forward direction.

The voltage difference between the body zone 30 and the third connection zone 40, above which charge carriers are sucked out of the body zone 30 by the pnp bipolar transistor T2, and, respectively, the current gain of this pnp bipolar transistor, depend on the doping of the base zone 50 and the distance a, formed by the base zone 50, between the body zone 30 and the third connection zone 40, that is to say between the emitter region and the collector region of the pnp bipolar transistor. The doping of the base zone and the distance a can be adjusted, depending on the requirements on the desired semiconductor switching element. The semiconductor switching element according to the invention also blocks when a positive voltage is applied between the source electrode S and the drain electrode D, the blocking voltage of the semiconductor switching element in this direction likewise being determined by the distance a and the doping of the base zone 50.

Figure 4:
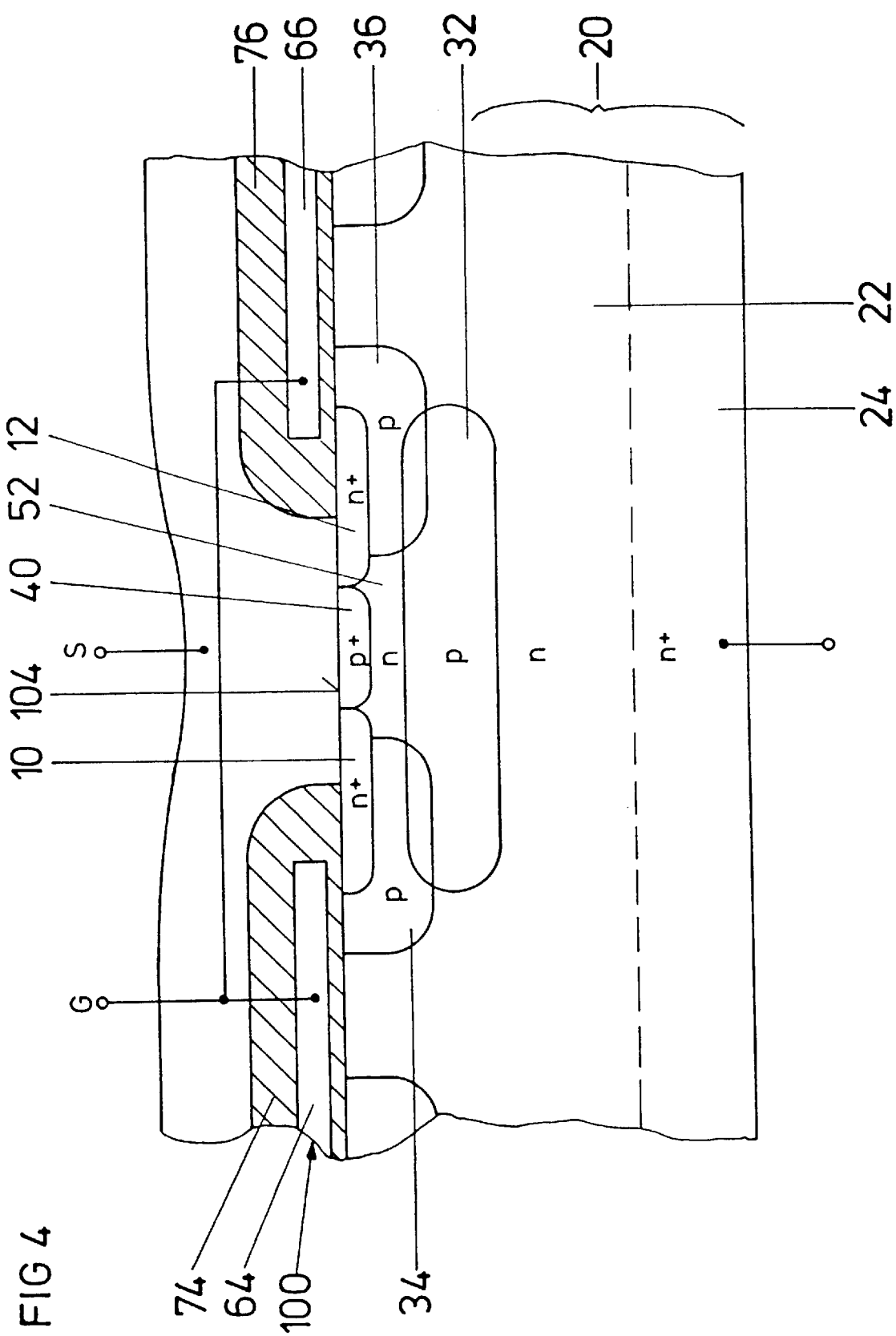
FIG. 4 is a cross-sectional illustration of a semiconductor switching element according to the invention in a second embodiment.

FIG. 4 shows a further exemplary embodiment of a semiconductor switching element according to the invention, which is integrated in a semiconductor body 100, control electrodes 64, 66 in this exemplary embodiment being arranged so that they are separated by an insulating layer 74, 76 on the front side 104 of the semiconductor body 100. First n-doped connection zones 10, 12 are incorporated in the semiconductor body 100, in the region of the front side 104 of the semiconductor body, as also in the exemplary embodiment illustrated in FIG. 2. The highly n-doped zones 10, 12, which form the source zone of the field effect transistor, are connected to a common electrically conductive layer 96 which is applied to the front side 104 of the semiconductor body. Arranged adjacent to the first connection zones, in the region of the front side 104, are third highly p-doped connection zones 40, the first connection zones 10, 12 and the third connection zones 40 being short-circuited by the electrically conductive layer 96. The first connection zones 10, 12 are partially surrounded by p-doped zones 34, 36, a further p-doped zone 32 overlapping the p-doped zones 34, 36 in order as a result to separate the first connection zones 10, 12 from the second connection zone 22, 24 making up the other region of the semiconductor body 100. The second connection zone forms the drain zone of the field effect transistor. The p-doped zones 32, 34, 36 form the body zone of the field effect transistor, one n-doped base zone 52 being arranged on that side of the body zone 32, 34, 36 which faces away from the second connection zone 20, between the body zone 32, 34, 36 and the first connection zone 10, 12.

When a drive potential is applied to the control electrodes 64, 66 and a positive voltage is applied between the drain electrode D and the source electrode S, conductive channels are formed in the body zone 34, 36 underneath the control electrodes 64, 66, in order to connect the first and second connection zones 10, 12, 20 conductively to one another. In the exemplary embodiment, the pnp bipolar transistor is formed by the body zone 32, 34, 36, the base zone 52 and the third connection zone 40, as a result of which positive charge carriers, which accumulate in the body zone 32, 34, 36, are led away to the source connection S, in order to prevent a parasitic bipolar transistor, which is formed by the first connection zones 10, 12, the body zone 32, 34, 36 and the second connection zone 22, 24, being driven.

Like the semiconductor switching element according to FIG. 2, the semiconductor switching element according to FIG. 4 also blocks both when a flow voltage is applied in the drain-source direction, and when a flow voltage is applied to the field effect transistor in the source-drain direction. The dielectric strength in the source-drain direction (reverse direction) also depends here on the doping of the base zone 52 and the width of the base zone 52 between the body zone 32 and the third connection zone 40.

The application of a voltage in the reverse direction loads the insulating layer 70, 72, 74 which surrounds the control electrode. According to the present reliability investigations, an insulating layer which is designed for a drive voltage of 15 V should function reliably for about 15 years even if, during faults in which a voltage occurs in the reverse direction, it is loaded for a few tens of seconds with voltages up to 42 V, such as occur in vehicle electrics.

I claim:

1. A semiconductor switching element, comprising:
   a control connection, a first load connection, and a second load connection;
   a field effect transistor with a gate, a source, a drain, and a body connection, said gate being connected to said control connection, said source being connected to said first load connection, said drain being connected to said second load connection;
   a bipolar transistor with a base, an emitter, and a collector, said emitter being connected to said body connection of said field effect transistor.

2. The semiconductor switching element according to claim 1, wherein said base and said collector are connected to said first load connection.

3. The semiconductor switching element according to claim 1, wherein said bipolar transistor is a transistor with a high current gain.

4. The semiconductor switching element according to claim 1, wherein said bipolar transistor is a transistor with a current gain of greater than 100.

5. The semiconductor switching element according to claim 1, wherein said field effect transistor is n-conductive, and said bipolar transistor is a pnp bipolar transistor.

6. The semiconductor switching element according to claim 1, wherein said field effect transistor is p-conductive, and said bipolar transistor is an npn bipolar transistor.

7. The semiconductor switching element according to claim 1, wherein said field effect transistor and said bipolar transistor are both integrated in the same semiconductor body.

8. The semiconductor switching element according to claim 1, wherein said field effect transistor and said bipolar transistor are in different semiconductor bodies.

9. An integrated semiconductor switching element, comprising:
   a first connection zone of a first conductivity type;
   a second connection zone of the first conductivity type;
   a body zone of a second conductivity type disposed between said first and second connection zones;
   a control electrode adjacent said body zone and an insulating layer separating said control electrode from said body zone;
   a third connection zone of the second conductivity type; and
   a base zone of the first conductivity type between said body zone and said third connection zone.

10. The semiconductor switching element according to claim 9, wherein said first connection zone and said third connection zone are short-circuited.

11. The semiconductor switching element according to claim 9, wherein said base zone extends between said body zone and said first connection zone.

12. The semiconductor switching element according to claim 9, wherein said base zone is less highly doped than said body zone.

* * * * *